(12) United States Patent
Kim et al.

(10) Patent No.: US 9,865,475 B2
(45) Date of Patent: Jan. 9, 2018

(54) DRY SEPARATION METHOD USING HIGH-SPEED PARTICLE BEAM

(71) Applicant: NPICS INC., Pohang-si, Gyeongsangbuk-do (KR)

(72) Inventors: In Ho Kim, Busan (KR); Jin Won Lee, Pohang-si (KR)

(73) Assignee: NPICS INC., Pohang-si, Gyeongsangbuk-Do (KR)

( * ) Notice: Subject to any disclaimer, the term of this patent is extended or adjusted under 35 U.S.C. 154(b) by 56 days.

(21) Appl. No.: 14/652,110

(22) PCT Filed: Dec. 18, 2013

(86) PCT No.: PCT/KR2013/011843
§ 371 (c)(1),
(2) Date: Jun. 13, 2015

(87) PCT Pub. No.: WO2014/098487
PCT Pub. Date: Jun. 26, 2014

(65) Prior Publication Data
US 2015/0325429 A1    Nov. 12, 2015

(30) Foreign Application Priority Data

Dec. 18, 2012 (KR) .................. 10-2012-0148974
Dec. 18, 2012 (KR) .................. 10-2012-0148975

(51) Int. Cl.
*H01L 21/02*    (2006.01)
*H01L 21/31*    (2006.01)
(Continued)

(52) U.S. Cl.
CPC .......... *H01L 21/31138* (2013.01); *G03F 7/40* (2013.01); *G03F 7/42* (2013.01);
(Continued)

(58) Field of Classification Search
CPC ......... H01L 21/02057; H01L 21/31058; H01L 21/31127; H01L 21/324; H01L 21/31138;
(Continued)

(56) References Cited

U.S. PATENT DOCUMENTS

2004/0018803 A1*    1/2004    Boumerzoug ............ B08B 5/02
                                                                                  451/39

FOREIGN PATENT DOCUMENTS

JP    2006-072083 A    3/2006
JP    2006-130406 A    5/2006
(Continued)

OTHER PUBLICATIONS

Search Report for International Application No. PCT/KR2013/011843.

*Primary Examiner* — Saeed T Chaudhry
(74) *Attorney, Agent, or Firm* — LRK Patent Law Firm

(57) ABSTRACT

A dry separation method is a dry separation method for ashing a photoresist, including a spraying and separating step of spraying sublimation particles on the photoresist and separating the photoresist. A dry separation apparatus is a dry separation apparatus for ashing a photoresist, including a nozzle for generating a high-speed particle beam that includes sublimation particles. The nozzle generates ultrahigh speed uniform nanoparticles by passing therethrough a particle generation gas including carbon dioxide, and includes an expanding portion having a shape so that the cross sectional area thereof becomes wider toward a discharge side of the nozzle. The expanding portion sequentially includes a first expanding portion and a second expanding portion, and an average expansion angle of the second expanding portion is bigger than an expansion angle of the first expanding portion.

8 Claims, 7 Drawing Sheets

(51) Int. Cl.
     *H01L 21/311*     (2006.01)
     *H01L 21/3105*   (2006.01)
     *H01L 21/324*     (2006.01)
     *G03F 7/42*        (2006.01)
     *G03F 7/40*        (2006.01)

(52) U.S. Cl.
     CPC .. *H01L 21/02057* (2013.01); *H01L 21/31058* (2013.01); *H01L 21/31116* (2013.01); *H01L 21/31127* (2013.01); *H01L 21/324* (2013.01)

(58) Field of Classification Search
     CPC ....... H01L 21/31144; G03F 7/42; B08B 7/00; B08B 7/04
     See application file for complete search history.

(56) References Cited

FOREIGN PATENT DOCUMENTS

| | | |
|---|---|---|
| JP | 2009-066983 A | 4/2009 |
| JP | 2009-078444 A | 4/2009 |
| KR | 10-0359339 B1 | 11/2002 |
| KR | 10-2004-0098751 A | 11/2004 |
| KR | 10-2004-0101948 A | 12/2004 |
| KR | 10-2006-0024478 A | 3/2006 |
| KR | 10-0662241 B1 | 12/2006 |
| KR | 10-2009-0050707 A | 5/2009 |
| KR | 10-2010-0135107 A | 12/2010 |

\* cited by examiner (a)

(b)

(a1)     (a2)

(b1)     (b2)

(a)

(b)

DRY SEPARATION METHOD USING HIGH-SPEED PARTICLE BEAM

TECHNICAL FIELD

The present invention relates to a dry separation apparatus, a nozzle for generating a high-speed particle beam for dry separation and a dry separation method using the high-speed particle beam, and more specifically, to a dry separation apparatus for removing a photoresist coated on the surface of a wafer by injecting sublimation high-speed particles for a process such as photolithography or the like performed in a process of manufacturing a semiconductor substrate, a nozzle for generating a high-speed particle beam for dry separation and a dry separation method using the high-speed particle beam.

BACKGROUND ART

A semiconductor element is generally manufactured by forming a pattern on a wafer through a photolithography process. More specifically, the semiconductor element is manufactured by forming a photoresist film on a wafer, forming a photoresist pattern by exposing and developing the photoresist film, and etching a silicon film formed on the wafer using the photoresist pattern.

For the photolithography process performed in the semiconductor manufacturing process, the surface of the wafer is etched after a photoresist is coated. A process of removing the photoresist remaining after the etching process is referred to as an ashing process, and removal of the remaining photoresist is mostly accomplished in a chemical method.

If the remaining photoresist is not completely removed, a problem of generating an additional defect occurs in a secondary process, and thus the ashing process is regarded as one of the most important parts in the semiconductor manufacturing process.

A chemical wet ashing process of the prior art has a problem in that it should diversely respond in accordance with the application characteristic of a photoresist used in a coating, and there are various problems as described below.

Looking into conventional techniques, Korean Laid-opened Patent No. 10-2004-0098751 specifies a separation liquid which can remove a modified and hardened resist within a short time period at a high or low temperature by adding a separation accelerator as well as a water-soluble organic amine, a polar solvent and a corrosion inhibitor. Korean Laid-opened Patent No. 10-2006-0024478 specifies a photoresist separation liquid composition which does not cause further corrosion of metal wires although an isopropyl alcohol (IPA) rinsing process is omitted and, in particular, significantly improves a separation force by applying a photoresist separation liquid composition containing a cyclic amine, a solvent, a corrosion inhibitor and a separation accelerator. Japanese Laid-opened Patent No. JP2006072083A discloses a technique capable of performing separation at a room temperature on a thermally hardened resist, as well as a general resist, by using phosphoric ester and dissolved ozone.

However, the separation solution disclosed in Korean Laid-opened Patent No. 10-2004-0098751 falls short of an effect of suppressing corrosion of a metal wire, and the separation solution disclosed in Korean Laid-opened Patent No. 10-2006-0024478 does not have a sufficient separation force for a resist created in a severe condition such as a dry etching residue since a cyclic amine is used, and the separation solution of Japanese Laid-opened Patent No. JP2006072083A is disadvantageous in that a metal film at a lower portion is highly probable to be corroded due to the dissolved ozone.

Furthermore, the chemical wet ashing method inevitably uses various chemicals and thus has fundamental problems such as environmental problems, maintenance cost and the like. In addition, although it has been tried much to solve the problems recently as described above, performance of removing the resist still has much to be improved.

DISCLOSURE OF INVENTION

Technical Problem

Therefore, the present invention has been made to solve the problems of the chemical wet ashing process described above, and it is an object of the present invention, moving away from the wet ashing process, to provide a dry separation apparatus, a nozzle for generating a high-speed particle beam for dry separation and a dry separation method using the high-speed particle beam, which can solve the problems of environmental pollution, maintenance cost and the like and drastically improve performance of separation by making it possible to perform a dry process of separating a photoresist by injecting sublimation solid particles.

Technical Solution

To accomplish the above object, according to one aspect of the present invention, there is provided a dry separation method for ashing a photoresist, the method including an injection and separation step of separating the photoresist by injecting sublimation particles on the photoresist.

According to another aspect of the present invention, there is provided a dry separation apparatus for ashing a photoresist, the apparatus including: a nozzle for generating a high-speed particle beam formed of sublimation particles, in which the nozzle generates high-speed uniform nanoparticles by passing a particle generation gas formed of carbon dioxide and includes a dilating portion of a shape increasing a cross-sectional area toward an outlet of the nozzle, in which the dilating portion is configured to sequentially include a first dilating portion and a second dilating portion, and an average dilation angle of the second dilating portion is wider than a dilation angle of the first dilating portion.

Advantageous Effects

The present invention has both economic and environmental advantages, as well as improved processing efficiency and productivity, by using a high-speed particle beam injection method of a new type, getting out of the problem caused by the complex facilities and processing steps according to existing chemical methods.

In addition, the present invention has an effect of significantly enhancing separation (ashing) efficiency by generating sublimation particles of a nano-size at a room temperature without a separate cooling device and, at the same time, injecting the particles at an extremely high speed.

More specifically, generation of nuclei of high number density and uniformity can be induced without a separate cooling device through rapid expansion of a particle generation gas by providing an orifice.

In addition, sublimation particles of a nano-size can be formed by growing nuclei generated through a first dilating portion having a gentle dilation angle, and the formed particles can be accelerated by expanding the particles at an increased dilation angle through a second dilating portion.

In addition, the separation (ashing) efficiency can be enhanced furthermore by providing a third dilating portion and adjusting a separation point, and proximity to an ashing object can be enhanced by obliquely cutting the outlet surface of the nozzle.

BRIEF DESCRIPTION OF THE DRAWINGS

FIG. 2(a) is a view showing a wafer before ashing, and FIG. 2(b) is a view showing the wafer after ashing.

FIG. 6(a) is a view showing a wafer before ashing, and FIG. 6(b) is a view showing the wafer after ashing.

BEST MODE FOR CARRYING OUT THE INVENTION

Hereafter, specific contents for embodying the present invention will be described in detail with reference to the accompanying drawings.

An embodiment of the present invention relates to a dry separation method, which can be largely divided into 1) a high-speed particle beam generation step and 2) an injection and separation step.

First, the 'injection and separation step' is described, and then the high-speed particle beam generation step will be described.

Figure 1:
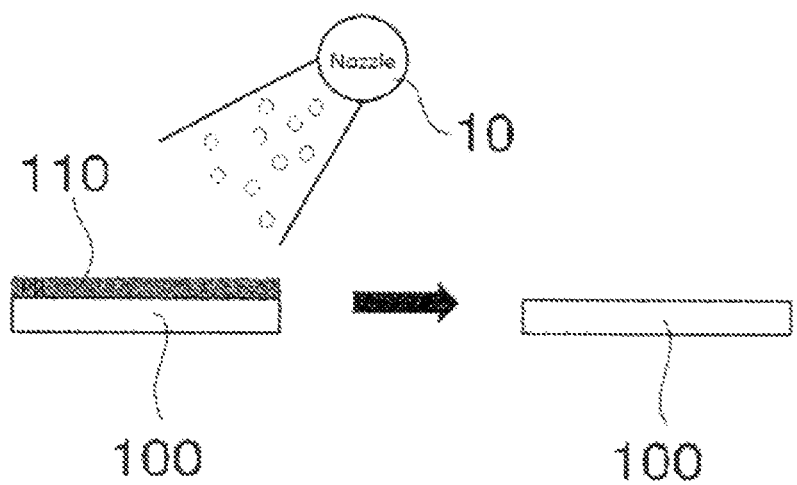
FIG. 1 is a conceptual view showing a process of removing a photoresist layer formed in a wide range, as a dry separation method according to an embodiment of the present invention.
Figure 3:
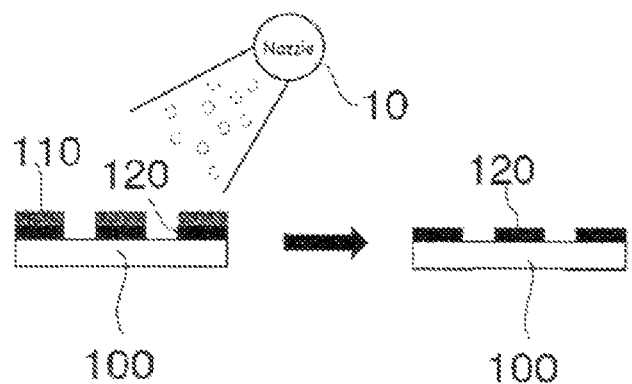
FIG. 3 is a conceptual view showing a process of removing a photoresist layer formed on a pattern after the pattern is formed, as a dry separation method according to an embodiment of the present invention.
Figure 5:
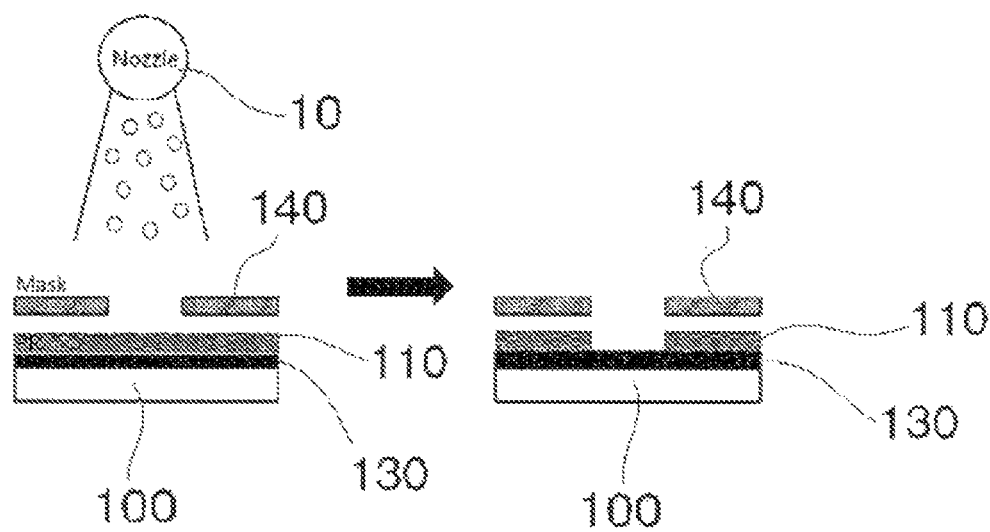
FIG. 5 is a conceptual view showing a process of selectively removing a photoresist layer using a mask for etching a photoresist, as a dry separation method according to an embodiment of the present invention.

FIGS. 1, 3 and 5 are views showing embodiments of the present invention diversely applied in the injection and separation step, and the injection and separation step is a dry separation method for ashing a photoresist as shown in FIGS. 1, 3 and 5, which is a process of separating a photoresist by injecting sublimation particles on the photoresist.

More specifically, FIG. 1 is a view showing an embodiment of a dry separation method according to the present invention, which is a conceptual view showing a process of removing a photoresist 110 layer formed on the top surface of a wafer 100 in a comparatively wide range. As shown in FIG. 1, the dry separation method according to an embodiment of the present invention shows a process of separating a predetermined area of the photoresist 110 evenly formed on the surface of the wafer 100 from the wafer 100.

Here, the photoresist 110 is directly formed on the surface of the wafer 100, and the injection and separation step herein is a process of separating the photoresist 110 from the surface of the wafer 100.

Figure 2:
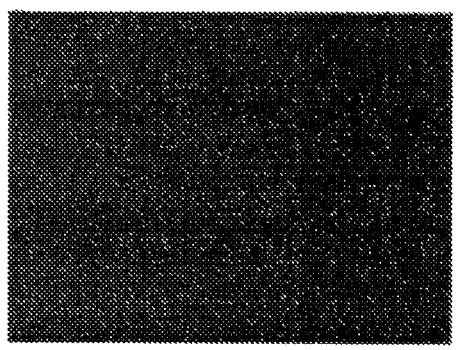
FIG. 2 is an experimental example showing a result according to FIG. 1.
Figure 2:
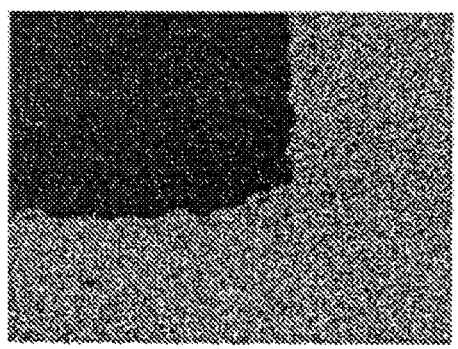

On the other hand, FIG. 2 is an experimental example showing a result according to the process of FIG. 1, and FIG. 2(a) is a view showing a wafer before ashing, and FIG. 2(b) is a view showing the wafer after ashing. It can be confirmed that although the surface of the wafer 100 is evenly covered with a photoresist 110 before ashing as shown in FIG. 2(a), a predetermined area of the photoresist 110 is cleanly separated after ashing as shown in FIG. 2(b).

In addition, FIG. 3 is a view showing an embodiment of a dry separation method according to the present invention, which is a conceptual view showing a process of forming a pattern unit 120 on the top surface of a wafer 100 and removing a photoresist 110 layer formed on the top surface of the pattern unit 120. As shown in FIG. 3, the dry separation method according to an embodiment of the present invention shows a process of separating the photoresist 110 from the pattern unit 120 formed on the top surface of the wafer 100.

Here, the photoresist 110 is directly formed on the surface of the pattern unit 120, and the injection and separation step herein is a process of separating the photoresist 110 from the surface of the pattern unit 120.

Figure 4:
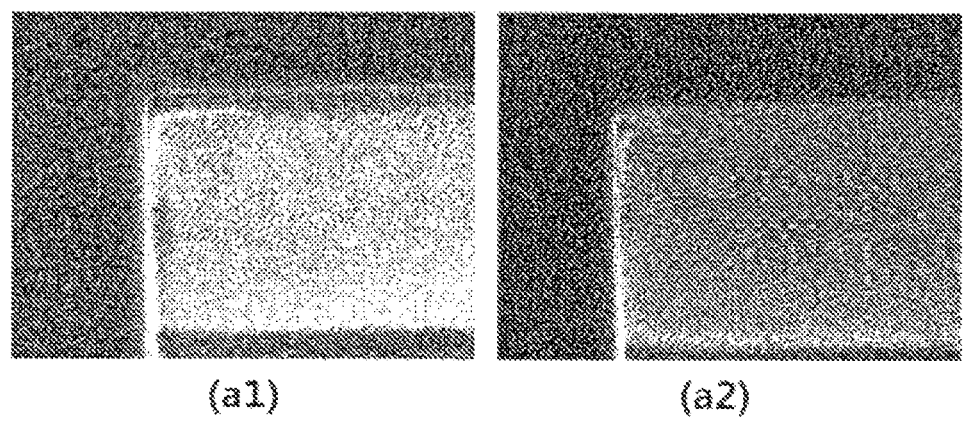
FIG. 4 is an experimental example showing a result according to FIG. 3, and FIG. 4(a1), (b1) is a view showing a wafer before ashing, and FIG. 4(a2), (b2) is a view showing the wafer after ashing.
Figure 4:
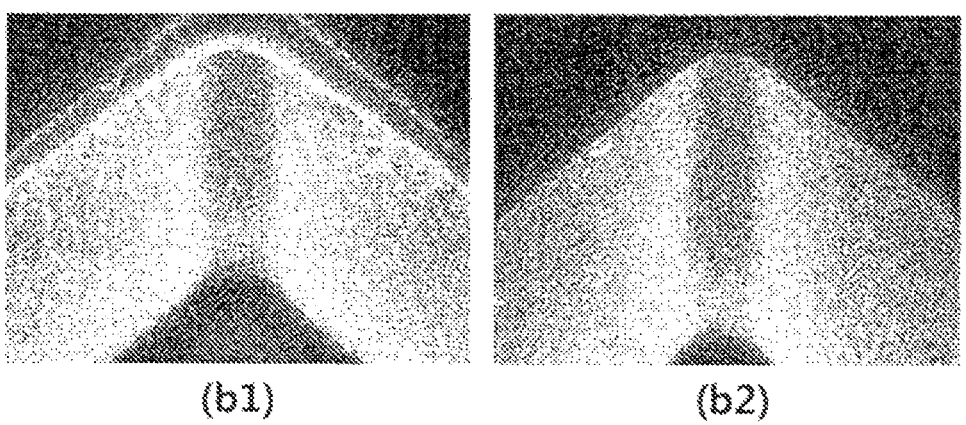

On the other hand, FIG. 4 is an experimental example, showing a result according to the process of FIG. 3, and FIGS. 4(a1) and (b1) are views showing a wafer before ashing, and FIGS. 4(a2) and (b2) are views showing the wafer after ashing. It can be confirmed that although the surface of the pattern unit 120 is covered with a photoresist 110 before ashing as shown in FIGS. 4(a1) and (b1), the photoresist 110 is separated and the surface of the pattern unit 120 is cleanly exposed after ashing as shown in FIGS. 4(a2) and (b2).

On the other hand, FIG. 5 is a view showing an embodiment of a dry separation method according to the present invention, which is a conceptual view showing a process of forming a pattern unit base material 130 on the top surface of a wafer 100 and selectively removing a photoresist 110 layer formed on the top surface of the pattern unit base material 130.

More specifically, the photoresist 110 formed on the top surface of the pattern unit base material 130 is selectively separated by providing a mask 140 on the top of the photoresist 110 layer so that sublimation particles may selectively pass through.

Here, the photoresist 110 is formed on the surface of the pattern unit base material 130, and the injection and separation step herein is a process of selectively separating the photoresist 110 from the surface of the pattern unit base material 130. This process makes it possible to form a pattern unit 120 according to the shape of a removed photoresist 110 by selectively removing the photoresist 110.

Figure 6:
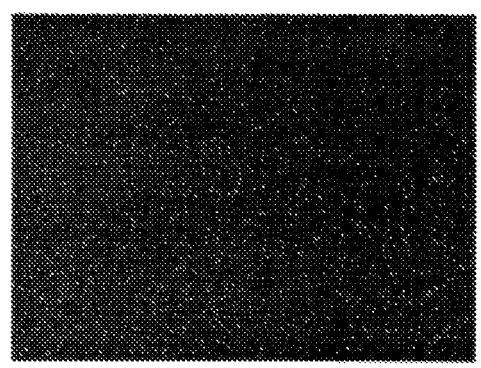
FIG. 6 is an experimental example showing a result according to FIG. 5.
Figure 6:
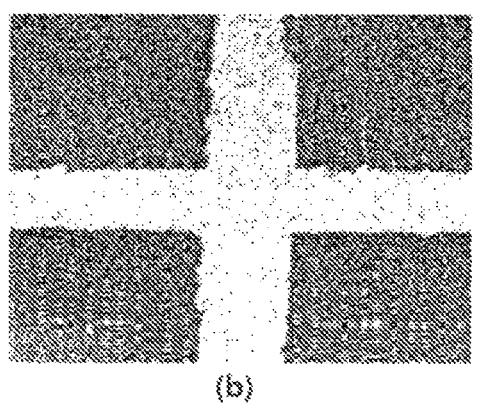

On the other hand, FIG. 6 is an experimental example showing a result according to the process of FIG. 5, and FIG. 6(a) is a view showing a wafer before ashing, and FIG. 6(b) is a view showing the wafer after ashing. It can be confirmed that although the surface of the pattern unit base material 130 is covered with a photoresist 110 before ashing as shown in FIG. 6(a), the photoresist 110 is separated according to the shape of the mask 140 after ashing as shown in FIG. 6(b).

Hereinafter, the 'high-speed particle beam generation step' will be described in detail.

Before describing the 'high-speed particle beam generation step' in detail, a 'nozzle for generating a high-speed particle beam' used in the 'high-speed particle beam generation step' will be described first.

Figure 7:
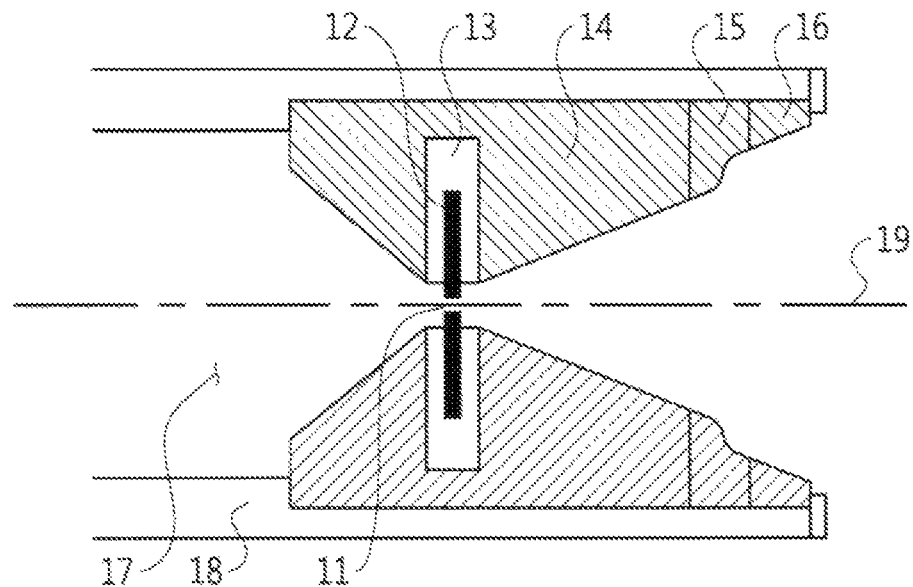
FIG. 7 is a cross-sectional view showing a nozzle for generating a high-speed particle beam according to an embodiment of the present invention.
Figure 8:
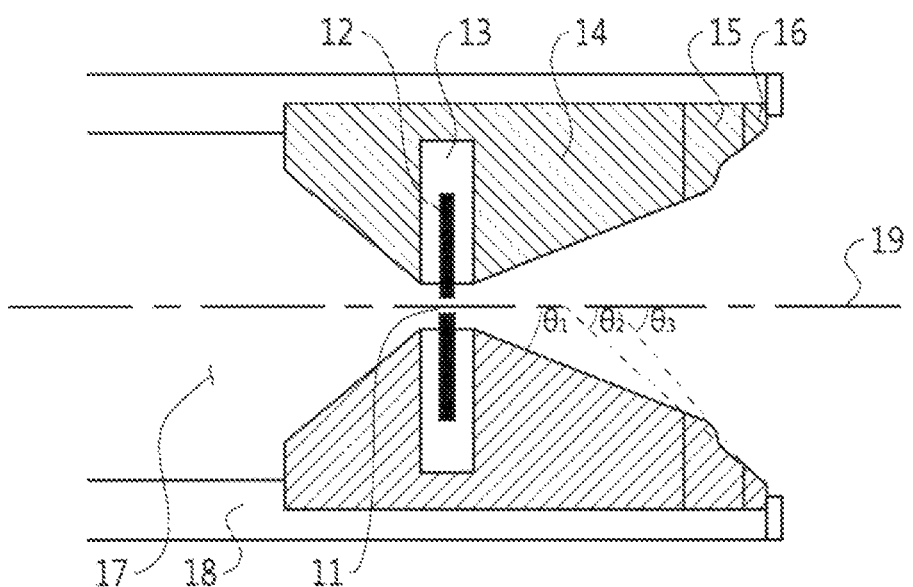
FIG. 8 is a cross-sectional view showing a dilation angle of a dilating portion of a nozzle for generating a high-speed particle beam according to an embodiment of the present invention.

FIGS. 7 and 8 are cross-sectional views schematically showing a nozzle for generating a high-speed particle beam according to an embodiment of the present invention.

A nozzle for generating a high-speed particle beam according to an embodiment of the present invention is configured to include an orifice 12 provided in a nozzle throat 11 and a dilating portion extended from the outlet of the nozzle throat 11.

First, the orifice 12 reduces the cross-sectional area of the nozzle throat 11 to a microscopic hole by adjusting the opening and closing cross-sectional area of the nozzle throat 11. A particle generation gas (or a mixture gas of a particle generation gas and a carrier gas) passing through the orifice 12 rapidly expands and generates nuclei of a nano-size.

In addition, although it is described that the orifice 12 is provided in the nozzle throat 11, since the nozzle throat 11 herein means a portion where the cross-sectional area is narrowest in the nozzle 10, a case of combining only the orifice 12 at the inlet side of the dilating portion is also included. That is, the orifice 12 itself may be regarded as a nozzle throat 11.

On the other hand, in the case of a nozzle of a device for generating particles according to the prior art, a process of cooling down the particle generation gas should be necessarily included for generation of nuclei, whereas in the case of the nozzle 10 according to the present invention, generation of nuclei can be induced at a room temperature without a separate cooling device by providing an orifice 12 having a microscopic hole to rapidly expand the particle generation gas. In addition, and it may be also possible to generate nuclei of a uniform size as the particle generation gas rapidly expands.

In addition, the orifice 12 may be formed in a shape of an aperture capable of adjusting the size of the microscopic hole, as well as in a shape having a microscopic hole of an invariable size, and, on the other hand, a method of adjusting the size of the microscopic hole by providing the orifice 12 mounted in the nozzle 10 in a replaceable form may also be considered.

In addition, the nozzle for generating a high-speed particle beam according to the present invention includes a dilating portion provided at the outlet side of the nozzle throat 11 or the outlet side of the orifice 12. The dilating portion is formed in a shape increasing the cross-sectional area toward the outlet side, unlike the particle generation nozzle of the prior art. The particle generation nozzle of the prior art is formed in a shape repeatedly increasing and decreasing the size of the cross-sectional area for growth of particles.

More specifically, the dilating portion is configured to include a first dilating portion 14 and a second dilating portion 15 respectively having a dilation angle different from the other.

The first dilating portion 14 preferably has a dilation angle $\theta_1$ of 0° to 30°, and as growth of nuclei is accomplished while the particle generation gas passes through a first dilating portion 14. The first dilating portion 14 is formed to have a comparatively gentle dilation angle $\theta_1$ compared with the second dilating portion 15 and provides a sufficient time for the nuclei to grow.

Although the first dilating portion 14 is formed to be comparatively long at a comparatively gentle dilation angle $\theta_1$ and induces growth of nuclei, it invites reduction of flowing speed since an effective area is reduced as the boundary layer is increased. Accordingly, the second dilating portion 15 capable of obtaining an additional accelerating force is installed to compensate the reduction of speed.

An average dilation angle $\theta_2$ of the second dilating portion 15 is preferable a dilation angle $\theta_2$ increased by 10° to 45° compared with the dilation angle $\theta_1$ of the first dilating portion 14. Since the second dilating portion 15 is formed to have an acute dilation angle compared with the first dilating portion 14 and forms a high area ratio between the inlet and the outlet, the particles are sufficiently accelerated. On the other hand, since the second dilating portion 15 does not have a single dilation angle unlike the first dilating portion 14 and a third dilating portion, the angle is expressed as an average angle.

If the dilation angle at the connection portion of the second dilating portion 15 is changed significantly in steps when the second dilating portion 15 is extended from the first dilating portion 14, an internal shock wave will be generated. Accordingly, the second dilating portion 15 is preferably formed in a shape having curves. Further specifically, the connection portion for connecting the second dilating portion 15 to the first dilating portion 14 is formed to have a dilation angle the same as the dilation angle $\theta_1$ of the outlet side of the first dilating portion 14, and the connection portion is formed to gradually increase the dilation angle toward the center of the second dilating portion 15 to form an acute inclination angle near the center and decrease the dilation angle from the center toward the outlet side of the second dilating portion 15 so that generation of the internal shock wave may be prevented.

Although it may be considered that the dilating portion of the nozzle for generating a high-speed particle beam according to an embodiment of the present invention is configured to include the first dilating portion 14 and the second dilating portion 15 as described above, on the other hand, it may be also considered to further include a third dilating portion 16.

The third dilating portion 16 is connected to the outlet of the second dilating portion 15 and forms a final outlet of the dilating portion. The third dilating portion 16 performs a function of adjusting a separation point of internal flow inside the nozzle 10.

It is preferable that the third dilating portion 16 has a dilation angle $\theta_3$ increased by 10° to 45° compared with the dilation angle $\theta_2$ of the second dilating portion 15 and lower than 90° in maximum.

If back pressure at the rear end of the nozzle 10 is low, a flow field may additionally grow since a separation point goes farther from the nozzle throat 11, and thus it is preferable to form the third dilating portion 16 to induce the separation point to be positioned at the end portion of the dilating portion while securing a sufficient length at the same time. It is since that washing efficiency can be increased greatly by forming the high-speed core (isentropic core) outside the nozzle 10.

On the other hand, if the back pressure at the rear end of the nozzle 10 is formed to be high, it may be regarded that the flow field has already grown sufficiently since the separation point comes closer to the nozzle throat 11, and thus it is preferable to expose the high-speed core at the outside of the nozzle 10 by reducing the length of the third dilating portion 16.

Meanwhile, the outer surface of the nozzle 10 is preferably wrapped with a heat insulation unit 18. The heat insulation unit 18 is configured of an external insulation tube and an insulating material filled therein. The heat insulation unit 18 accelerates growth of particles by maintaining thermal resistance of the nozzle 10 and, at the same time, provides mechanical strength by forming an outer wall so that the nozzle 10 may endure a high pressure gas. In addition, it is preferable that they are formed in one piece to wrap the whole side surface of the nozzle 10.

Figure 9:
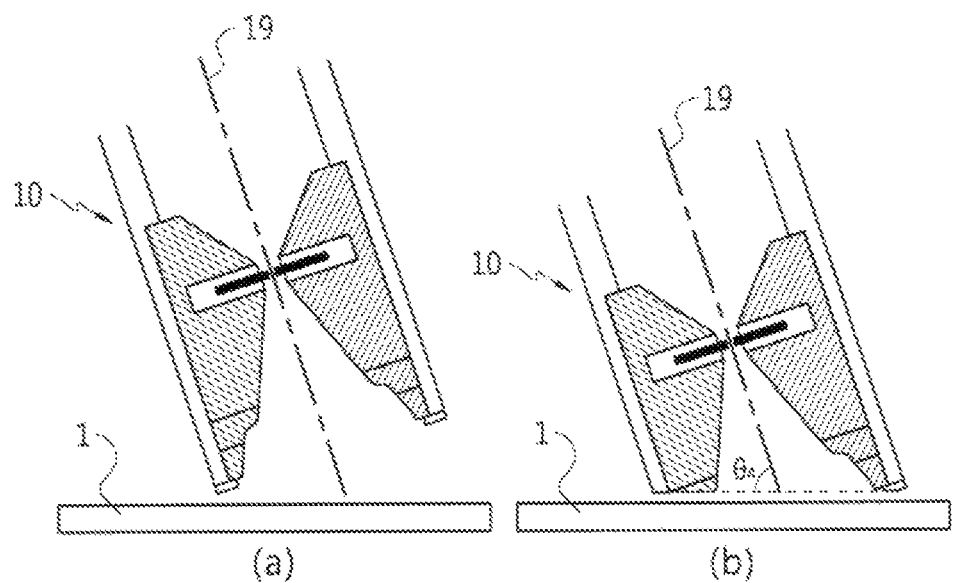
FIG. 9 is a conceptual view showing a proximity relation between a nozzle for generating a high-speed particle beam according to an embodiment of the present invention and an object.

Meanwhile, FIG. 9 is a conceptual view showing a proximity relation between a nozzle for generating a high-speed particle beam according to an embodiment of the present invention and an object 1.

FIG. 9(a) is a view showing a positional relation between the outlet surface of the nozzle 10 and the object 1 of a general case, and FIG. 9(b) is a view showing the outlet surface of the nozzle obliquely cut to approach the nozzle to the object 1 further closer.

As shown in FIG. 9(a), the nozzle 10 generally performs an ashing work while being slanted at a predetermined angle. In this case, there is a problem in that ashing efficiency is lowered since the outlet of the nozzle 10 cannot fully approach the object 1 due to the characteristic of a cylindrical shape.

Accordingly, in order to solve this problem, it is preferable to provide the outlet surface of the nozzle 10 in a form obliquely cut as shown in FIG. 9(b) so as to correspond to a working angle of the nozzle 10. The cutting angle $\theta_4$ of the shape cut as described above is preferably determined within a range of 20° to 90° with respect to the nozzle axis 19.

A nozzle for generating a high-speed particle beam according to an embodiment of the present invention has been described above. Hereinafter, a dry separation apparatus including such a nozzle 10 will be described.

Figure 10:
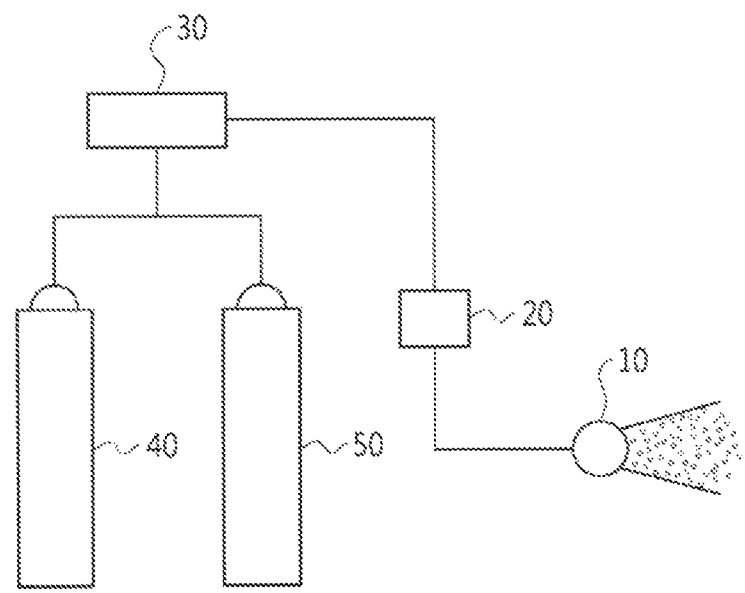
FIG. 10 is a view showing major parts configuring a dry separation apparatus according to an embodiment of the present invention.
Figure 11:
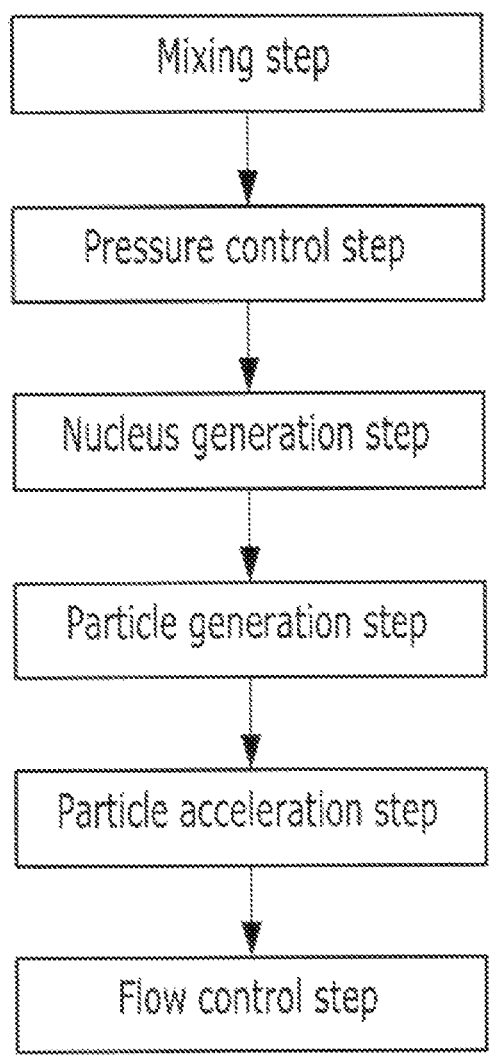
FIG. 11 is a flowchart illustrating detailed steps of a high-speed particle beam generation step of a case using a mixture gas according to an embodiment of the present invention.
Figure 12:
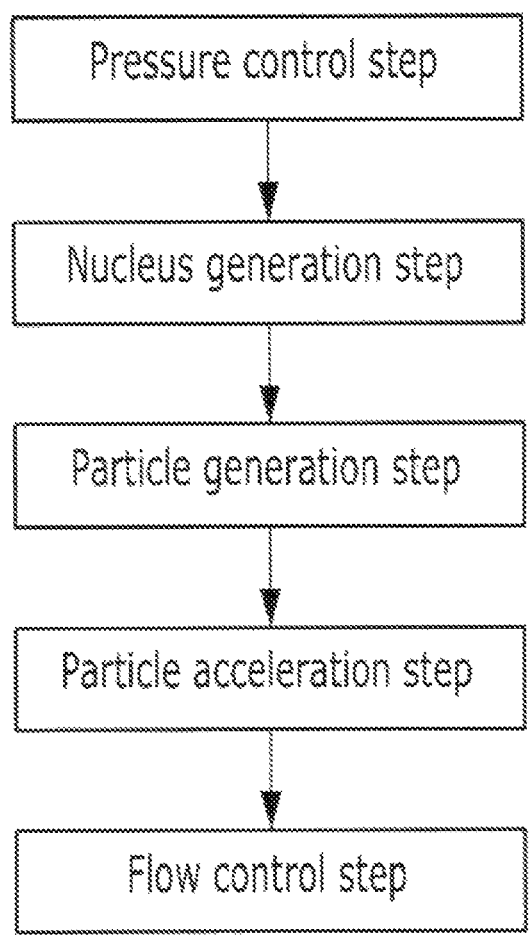
FIG. 12 is a flowchart illustrating detailed steps of a high-speed particle beam generation step of a case using a pure particle generation gas according to an embodiment of the present invention.

FIG. 10 is a view showing major parts configuring a dry separation apparatus according to an embodiment of the present invention.

A dry separation apparatus according to the present invention may be divided into i) a case of using a mixture of a particle generation gas and a carrier gas and ii) a case of using only a particle generation gas.

First, i) in the case of using a mixture of a particle generation gas and a carrier gas, the device is configured to include a gas storage unit including a particle generation gas storage unit 40 and a carrier gas storage unit 50, a mixing chamber 30, a pressure controller 20 and a nozzle 10 as shown in FIG. 1.

In addition, ii) in the case of using only a particle generation gas, the device does not include the carrier gas storage unit 50 and a mixing unit.

In the case of using a mixture of a particle generation gas and a carrier gas, a particle generation gas storage unit 40 and a carrier gas storage unit 50 are connected to a mixing chamber 30. It is preferable that carbon dioxide is used as a particle generation gas as described above, and nitrogen or helium is used as a carrier gas. The mixing chamber 30 performs a function of sufficiently mixing the particle generation gas and the carrier gas and, at the same time, adjusting a mixing ratio. It is preferable that the mixing ratio is adjusted to form a carbon dioxide mixture gas by mixing the carrier gas with the particle generation gas to occupy 10 to 99% of the total volume of the mixture.

The mixture gas mixed in the mixing chamber 30 flows into a pressure controller 20. The pressure controller 20 controls pressure for supplying the mixture gas to the nozzle 10.

On the other hand, in the case of using only a particle generation gas formed of carbon dioxide, it may be considered to supply the particle generation gas to the pressure controller 20 by directly connecting the particle generation gas storage unit 40 to the pressure controller 20 without passing through the mixing chamber 30. Hereinafter, a particle generation gas of the case using only a particle generation gas will be referred to as a pure particle generation gas as a concept contrasting to the mixture gas.

In addition, it is preferable that output pressure at the pressure controller 20 is formed within a range of i) 5 to 120 bar in the case of the mixture gas and ii) 5 to 60 bar in the case of the pure particle generation gas, considering the size and injection speed of the generated sublimation particles.

The mixture gas or the pure particle generation gas passing through the pressure controller 20 is supplied to the inlet of the nozzle 10.

The mixture gas or the pure particle generation gas supplied to the inlet of the nozzle 10 sequentially passes through the orifice 12, the first dilating portion 14 and the second dilating portion 15 as described above, and the sublimation nano-particles are injected onto the object 1. Since the detailed internal structure of the nozzle 10 is described above, overlapped descriptions will be omitted.

Hereinafter, a 'high-speed particle beam generation step' according to an embodiment of the present invention will be described.

A high-speed particle beam generation step according to an embodiment of the present invention is generating high-speed uniform nanoparticles by passing a particle generation gas formed of carbon dioxide through the nozzle 10. Here, the particle generation gas may be mixed with the carrier gas and supplied to the nozzle of a mixture gas or may be supplied in the form of a pure particle generation gas.

First, when the particle generation gas is supplied in the form of a mixture gas, it is preferable to sequentially include a mixing step of forming the mixture gas by mixing the particle generation gas and the carrier gas and a pressure control step of adjusting pressure of the mixture gas passing through the mixing step.

Here, the carrier gas is formed of nitrogen or helium, and it is preferable to control the pressure of the mixture gas passing through the pressure control step to 5 to 120 bar and flow the mixture gas into the nozzle 10.

After performing the pressure control step, the nucleus generation step of generating nuclei is performed as the particle generation gas rapidly expands while passing through an orifice 12 provided in a nozzle throat 11 of the nozzle 10.

Then, after performing the nucleus generation step, the particle generation step of generating sublimation particles is performed as growth of nuclei is accomplished while the particle generation gas passes through a first dilating portion 14 extended from the outlet of the nozzle throat 11 and having a dilation angle $\theta_1$ of 0° to 30°.

Then, after performing the particle generation step, the particle acceleration step of offsetting growth of a boundary layer and increasing the speed of injecting the sublimation particles is performed as the particle generation gas passes through the second dilating portion 15 extended from the outlet of the first dilating portion 14 and having an average dilation angle $\theta_2$ increased by 10° to 45° compared with the dilation angle $\theta_1$ of the first dilating portion 14.

It is preferable to further include, after performing the particle acceleration step, the flow control step of forming a high-speed core of the sublimation particles outside the nozzle 10 as the particle generation gas passes through the third dilating portion 16 extended from the outlet of the second dilating portion 15 and having a dilation angle $\theta_3$ increased by 10° to 45° compared with the average dilation angle $\theta_2$ of the second dilating portion 15 and lower than 90° in maximum.

On the other hand, in the case of supplying only the pure particle generation gas, a pressure control step of adjusting the pressure of the particle generation gas is performed without performing the mixing step.

Here, it is preferable that pressure of the particle generation gas passing through the pressure control step is controlled to 5 to 60 bar to flow the particle generation gas into the nozzle 10.

The steps following thereafter are the same as the nucleus generation step, the particle generation step, the particle acceleration step and the flow control step.

The positional relations used to describe a preferred embodiment of the present invention are described focusing on the accompanying drawings, and the positional relations may be changed according to the aspect of an embodiment.

In addition, unless otherwise defined, all terms used in the present invention, including technical or scientific terms, have the same meanings as those generally understood by those with ordinary knowledge in the field of art to which the present invention belongs. In addition, the terms should not be interpreted to have ideal or excessively formal meanings unless clearly defined in the present application.

Although the preferred embodiment of the present invention has been described above, it should be regarded that embodiments simply aggregating prior arts with the present invention or simply modifying the present invention, as well as the present invention, also fall within the scope of the present invention.

The invention claimed is:

1. A dry separation method for ashing a photoresist, the method comprising:
    a high-speed particle beam generation step of generating sublimation particles; and
    an injection and separation step of separating the photoresist by injecting the sublimation particles on the photoresist,
    wherein the high-speed particle beam generation step is characterized in that a particle generation gas passing through a nozzle is injected onto an object, wherein the nozzle includes a first dilating portion and a second dilating portion, and an average dilation angle of the second dilating portion is wider than a dilation angle of the first dilating portion, and
    wherein the injection and separation step comprises:
    a nucleus generation step of generating nuclei at room temperatures without an extra cooling device by passing the particle generation gas through an orifice and rapidly expanding the particle generation gas, wherein the orifice is provided in a nozzle throat of the nozzle to reduce a cross-sectional area of the nozzle throat to a microscopic hole;
    a particle generation step of generating the sublimation particles by growing the nuclei while passing the particle generation gas through the first dilating portion after performing the nucleus generation step, wherein the first dilating portion is extended from an outlet of the nozzle throat so that a cross-sectional area of the first dilating portion gradually widens; and
    a particle acceleration step of increasing speed of injecting the sublimation particles by passing the particle generation gas through the second dilating portion after performing the particle generation step, wherein the second dilating portion is extended from an outlet of the first dilating portion so that a cross-sectional area of the second dilating portion gradually widens, and the second dilating portion has the average dilation angle wider than the dilation angle of the first dilating portion.

2. The method according to claim 1, wherein the photoresist is formed on a surface of a wafer, and a predetermined area of the photoresist is separated from the wafer by injecting the sublimation particles on the photoresist.

3. The method according to claim 1, wherein the photoresist is formed on a surface of a pattern unit formed on a wafer, and the photoresist is separated from the pattern unit by injecting the sublimation nanoparticles on the photoresist.

4. The method according to claim 1, wherein the photoresist is formed on a surface of a pattern unit base material formed on a wafer, and the photoresist is separated from the pattern unit base material by injecting the sublimation nanoparticles on the photoresist.

5. The method according to claim 1, wherein the photoresist is formed on a surface of a pattern unit base material formed on a wafer, and a predetermined area of the photoresist is selectively separated from the pattern unit base material by injecting the sublimation nanoparticles on the photoresist.

6. The method according to claim 5, wherein the predetermined area of the photoresist is selectively separated from the pattern unit base material by providing a mask on a top of the photoresist.

7. The method according to claim 1, wherein the particle generation gas is formed of carbon dioxide, and the first dilating portion has a dilation angle of 0° to 30°, whereas the second dilating portion has an average dilation angle which is 10° to 45° more than the dilation angle of the first dilating portion.

8. The method according to claim 7, wherein the high-speed particle beam generation step further includes, after performing the particle acceleration step, a flow control step of forming a high-speed core of the sublimation particles outside the nozzle by passing the particle generation gas through a third dilating portion, wherein the third dilating portion is extended from an outlet of the second dilating portion and has a dilation angle which is 10° to 45° more than the average dilation angle of the second dilating portion and lower than 90° in maximum.

* * * * *